United States Patent
Ling et al.

(10) Patent No.: US 11,609,889 B1
(45) Date of Patent: Mar. 21, 2023

(54) REORDERING DATASETS IN A TABLE FOR INCREASED COMPRESSION RATIO

(71) Applicant: International Business Machines Corporation, Armonk, NY (US)

(72) Inventors: Jie Ling, Beijing (CN); Yu Huang, Beijing (CN); Shan Jiang, Beijing (CN); Yan Li Ma, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/447,940

(22) Filed: Sep. 17, 2021

(51) Int. Cl.
  *G06F 16/215* (2019.01)
  *H03M 7/30* (2006.01)
  *G06F 16/22* (2019.01)

(52) U.S. Cl.
  CPC ........ *G06F 16/215* (2019.01); *G06F 16/2282* (2019.01); *H03M 7/3088* (2013.01)

(58) Field of Classification Search
  CPC . G06F 16/215; G06F 16/2282; H03M 7/3088
  USPC ...................................................... 707/694
  See application file for complete search history.

(56) References Cited

U.S. PATENT DOCUMENTS

| | | | |
|---|---|---|---|
| 7,720,878 B2 | 5/2010 | Caldwell | |
| 2003/0130855 A1 | 7/2003 | Babu | |
| 2008/0294676 A1* | 11/2008 | Faerber | G06F 16/2455 707/999.102 |
| 2014/0279961 A1* | 9/2014 | Schreter | G06F 3/0673 707/693 |
| 2015/0347426 A1 | 12/2015 | Dickie | |
| 2016/0092497 A1 | 3/2016 | Oberhofer | |
| 2016/0292220 A1* | 10/2016 | Verma | G06F 16/24561 |
| 2017/0004157 A1 | 1/2017 | Varadarajan | |
| 2018/0137158 A1* | 5/2018 | Hoffmann | G06F 16/221 |
| 2020/0192884 A1* | 6/2020 | Bao | H03M 7/3082 |
| 2021/0216564 A1* | 7/2021 | Noll | G06F 16/2365 |

OTHER PUBLICATIONS

Lee et al., "Compression Schemes with Data Reordering for Ordered Data", Journal of Database Management, 25(1), 1-28, Jan.-Mar. 2014, Copyright © 2014, IGI Global, 28 pages.
Lemire et al., "Reordering Columns for Smaller Indexes", arXiv:0909.1346v8 [cs.DB] Feb. 22, 2011, 38 pages.

* cited by examiner

*Primary Examiner* — Hicham Skhoun

(74) *Attorney, Agent, or Firm* — Stephen R. Yoder

(57) ABSTRACT

Selecting tables for compression by threshold statistical values. Identified tables are reordered according to fields having the lowest cardinality to increase the size of character strings replaced by keys during compression. Field locations are mapped between the original table and the reordered table. Dictionary-based compression is performed on reordered tables.

17 Claims, 3 Drawing Sheets

REORDERING DATASETS IN A TABLE FOR INCREASED COMPRESSION RATIO

BACKGROUND

The present invention relates generally to the field of data compression, and more particularly to compressing database tables.

It is known to perform dictionary compression on table data without revising the order in which the data is presented. Compression is commonly used in storage area including database, to reduce data size. Smaller data size can reduce ownership cost, achieve better throughput, and many more benefit.

Dictionary-based compression algorithms work by parsing the input into a sequence of substrings and by encoding a compact representation of these substrings. A dictionary coder, or substitution coder, is a variety of lossless data compression algorithms which operate by searching for matches between the text to be compressed and a set of strings contained in a data structure maintained by the encoder. When the encoder finds such a match, it substitutes a reference to the string's position in the data structure.

Data definition language (DDL) is a standard for commands that define the different structures in a database. DDL statements create, modify, and remove database objects such as tables, indexes, and users.

In databases, cardinality typically refers to the relationships between the data in two database tables. Cardinality defines how many instances of one entity are related to instances of another entity. As used herein where each record is represented by a row and fields are represented by columns, cardinality refers to the occurrence of unique values within a field. Cardinality also refers to the occurrence of unique values combined across multiple fields.

SUMMARY

In one aspect of the present invention, a method, a computer program product, and a system for reordering data distribution in database tables includes: (i) identifying a threshold ratio for reordering field locations in database tables; (ii) determining to reorder the field locations in a first database table based on the first database table meeting the threshold ratio; (iii) determining field data cardinality for a set of fields in the first database; and (iv) reordering a plurality of fields of the first database table, the plurality of fields having field data cardinality values lower than other fields in the set of fields. The reordering step rearranges the fields and corresponding data such that a first field in the reordered database table having a lowest field data cardinality value is a leading field and an adjacent field has a second lowest field data cardinality value.

In another aspect of the present invention, a method, a computer program product, and a system for reordering data distribution in database tables includes: (i) collecting statistical data for the database tables including the number of identical values in each field of the database tables, a data volume of each database table, and field data cardinality for each field in the database tables; and (ii) mapping field locations of the first database table prior to reordering the plurality of fields; (iii) mapping target field locations of the first database table according to the reordering step where the first field in the reordered database table having the lowest field data cardinality value is the leading field and the adjacent field has the second lowest field data cardinality value; and (iv) rebuilding a compression dictionary according to sets of leading record values of the reordered table.

DETAILED DESCRIPTION

Figure 1:
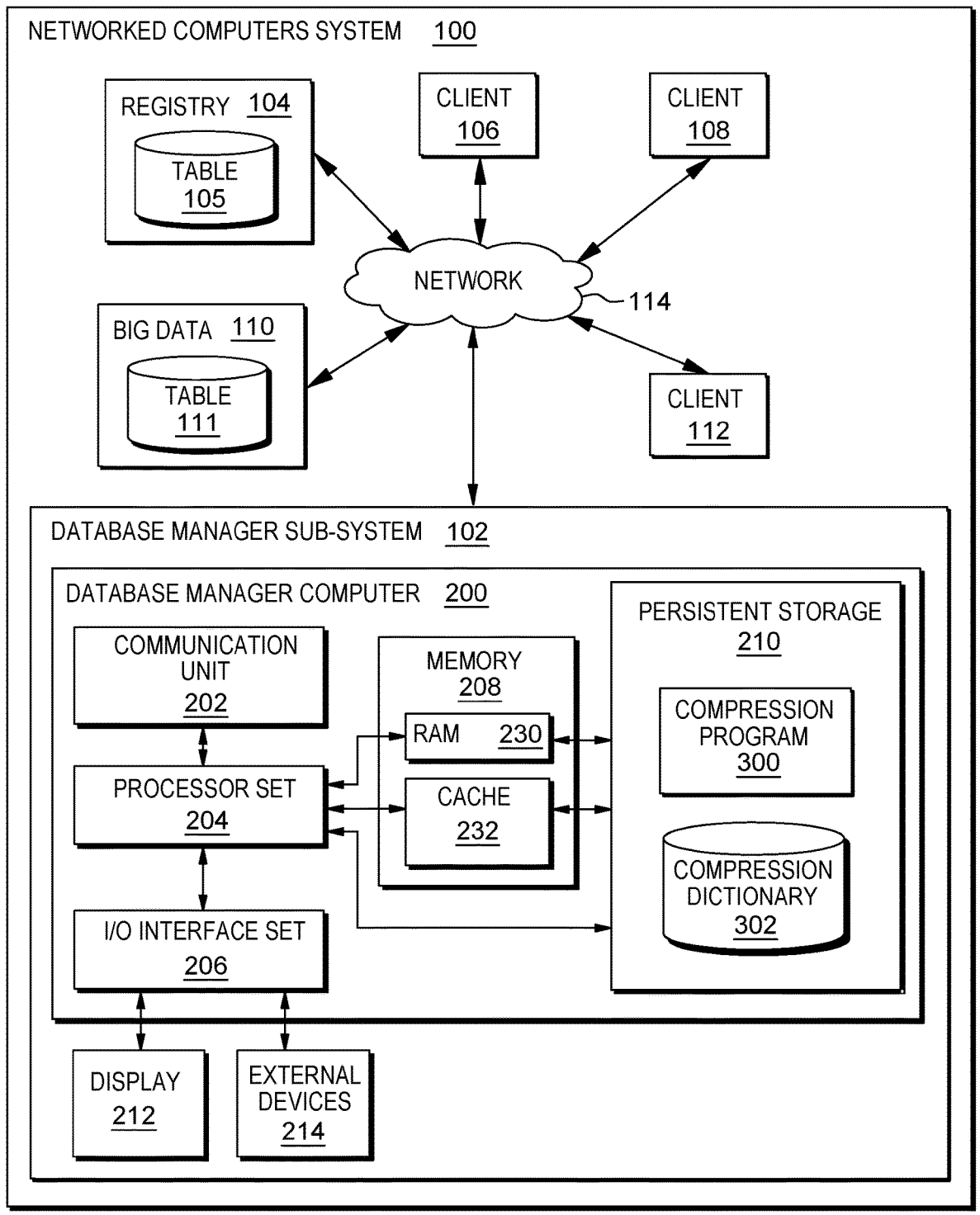
FIG. 1 is a schematic view of a first embodiment of a system according to the present invention.

Selecting tables for compression by threshold statistical values. Identified tables are reordered according to fields having the lowest cardinality to increase the size of character strings replaced by keys during compression. Field locations are mapped between the original table and the reordered table. Dictionary-based compression is performed on reordered tables. The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium, or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network, and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The present invention will now be described in detail with reference to the Figures. FIG. 1 is a functional block diagram illustrating various portions of networked computers system 100, in accordance with one embodiment of the present invention, including: database manager sub-system 102; registry sub-system 104; big data sub-system 110; database tables 105, 111; client sub-systems 106, 108, 112; communication network 114; database manager computer 200; communication unit 202; processor set 204; input/output (I/O) interface set 206; memory device 208; persistent storage device 210; display device 212; external device set 214; random access memory (RAM) devices 230; cache memory device 232; table compression program 300; and table compression dictionary 302.

Sub-system 102 is, in many respects, representative of the various computer sub-system(s) in the present invention. Accordingly, several portions of sub-system 102 will now be discussed in the following paragraphs.

Sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Program 300 is a collection of machine readable instructions and/or data that is used to create, manage, and control certain software functions that will be discussed in detail below.

Sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

Sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware component within a system. For example, the communications fabric can be implemented, at least in part, with one or more buses.

Memory 208 and persistent storage 210 are computer readable storage media. In general, memory 208 can include any suitable volatile or non-volatile computer readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions, and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either, or both, physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with computer 200. For example, I/O interface set 206 provides a connection to external device set 214. External device set 214 will typically include devices such as a keyboard, keypad, a touch screen, and/or some other suitable input device. External device set 214 can also include portable computer readable storage media such as, for example, thumb drives, portable optical or magnetic disks, and memory cards. Software and data used to practice embodiments of the present invention, for example, program 300, can be stored on such portable computer readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the present invention. However, it should be appreciated that any particular program nomenclature herein is used merely for convenience, and thus the present invention should not be limited to use solely in any specific application identified and/or implied by such nomenclature.

Table compression program 300 operates to collect statistical data on target database tables to identify a table suitable for reordering to improve the compression ratio. Field data cardinality is computed to determine which fields to reorder in the table. Upon reordering the table, compression algorithms are applied to compress the table. Reordering provides for reduced storage size over the previously stored table.

Some embodiments of the present invention recognize the following facts, potential problems and/or potential areas for improvement with respect to the current state of the art: (i) the "as-is data distribution" of a table as is done in conventional practice may not be optimal for the compression algorithm to achieve the best compression ratio; (ii) it is often found that some of the columns in a table include text having a relatively small cardinality such that the data of certain columns is more duplicated than others; (iii) compression is commonly used to reduce data size; (iv) smaller data size can reduce ownership cost, achieve better throughput, and many more benefit; (v) existing database dictionary compression method focuses on how to find the shortest replacement for character strings in their original locations; (vi) for conventional data compression, the data in the table is compressed as-is so the compression ratio varies according to the data distribution in the table; (vii) the compression ratio for data in a table can vary largely with different data distribution; (viii) the compression ratio can vary largely with different data; (ix) optimized data distribution in a table enable the compression algorithm to recognize longer duplicate strings; and/or (x) improper or random distribution of data in database can impact compression ratio dramatically.

As discussed here, field data is a set of data from records in a table corresponding to a single field or heading. The field data may be recorded as either a column or row in the table. Where the field data is recorded in a column, the individual records of the table are recorded in rows.

Some embodiments of the present invention are directed to utilizing table column statistics to redistribute table data to achieve a better compression ratio.

Some embodiments of the present invention are directed to a method for determining a need to reorder columns in a table by evaluating the ratio of identical data to data volume against a threshold ratio for reordering columns.

Some embodiments of the present invention are directed to mapping the relationship of columns, or data fields, between before and after the reordering state of the column. Mapping at least prevents incompatible changes for legacy applications.

Some embodiments of the present invention recognize the special characteristics of table data in database. With reference to statistics of the table columns, the poorly distributed data is rearranged to support efficient application of a dictionary compression algorithm to achieve an improved compression ratio compared to the compression ratio if the columns were not rearranged.

Some embodiments of the present invention are directed to achieving smaller compressed data size for a database table after compression. One way to achieve this is to reorganize the columns of data so that the lower cardinality columns are adjacent to one another so that common rows including multiple adjacent columns may be compressed as a single character string.

Some embodiments of the present invention identify a data distribution pattern in data fields of database tables so that reordering the columns operates to improve distribution of common data for any given row. In that way, the dictionary compression algorithm achieves a better compression ratio of the reordered database table.

Some embodiments of the present invention are directed to a process that includes using database table statistics to identify columns of data that can be reordered for improved compression ratio when compressed and to mapping relationships between the before and after reordering the columns to prevent incompatible changes in legacy applications.

Figure 2:
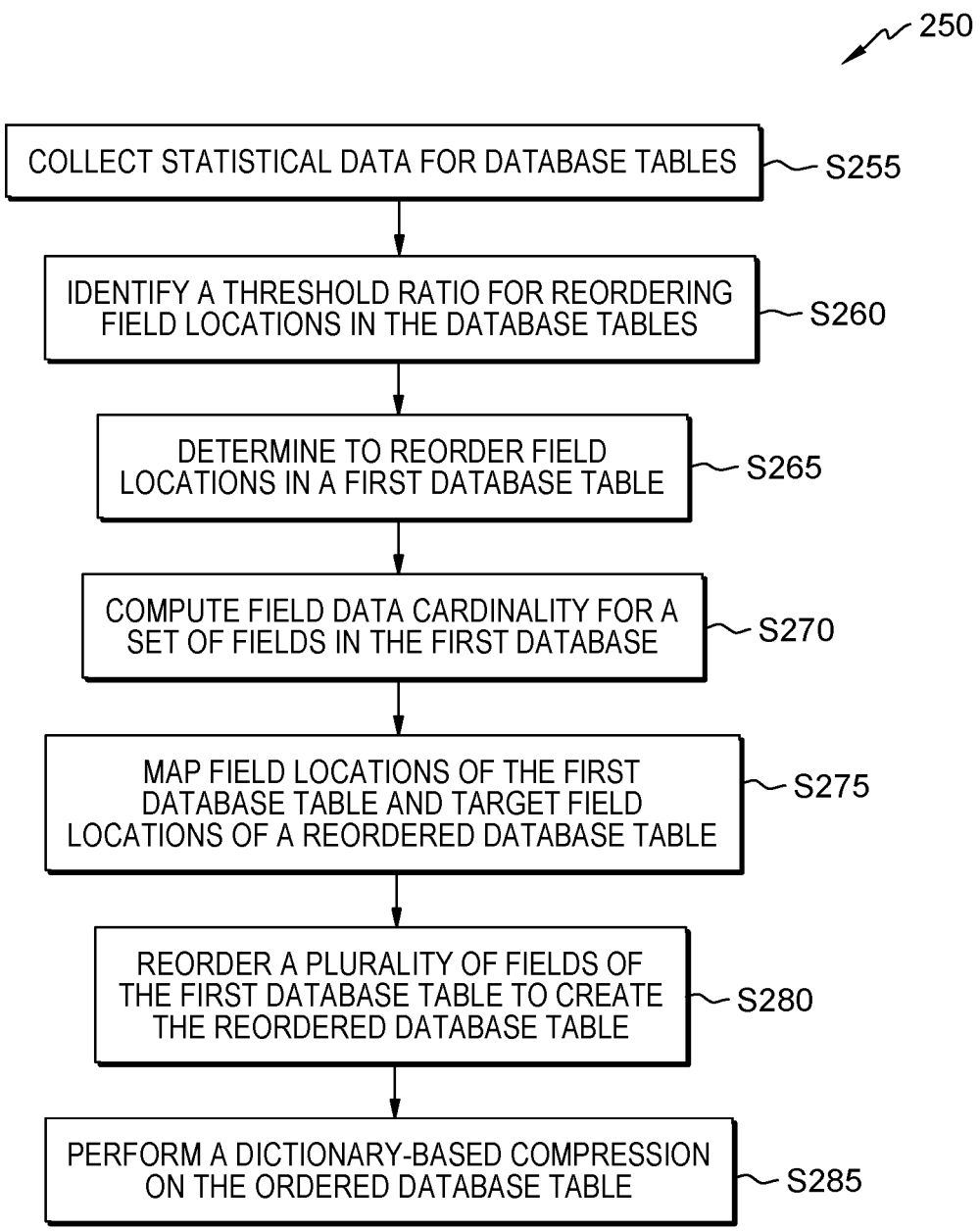
FIG. 2 is a flowchart showing a method performed, at least in part, by the first embodiment system.
Figure 3:
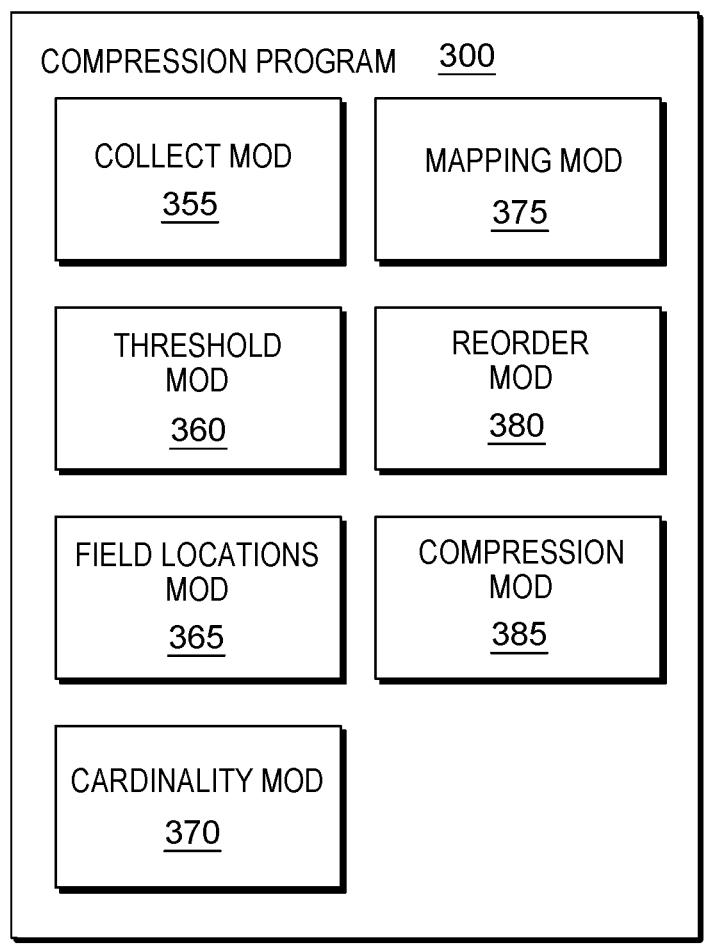
FIG. 3 is a schematic view of a machine logic (for example, software) portion of the first embodiment system.

FIG. 2 shows flowchart 250 depicting a first method according to the present invention. FIG. 3 shows program 300 for performing at least some of the method steps of flowchart 250. This method and associated software will now be discussed, over the course of the following paragraphs, with extensive reference to FIG. 2 (for the method step blocks) and FIG. 3 (for the software blocks).

Processing begins at step S255, where collect module ("mod") 355 collects statistical data for database tables. In this example, each database table being evaluated is processed by performing RUNSTATS on the table to identify and collect various statistics on the table. Statistics of interest may include: (i) identical data within a given field dataset; (ii) volume of data in each field dataset; (iii) volume of data in the table; and/or (iv) locations of field data relative to other fields within the table, whether by column or row. According to some embodiments of the present invention, the statistical data is already identified, so in this step relevant statistics are collected from the identified information. Alternatively, relevant statistical data is input into the database manager for the purpose of taking at least some of the steps that follow.

Processing proceeds to step S260, where threshold mod 360 identifies a threshold ratio for reordering field locations in the database tables. In this example, the threshold ratio is an assigned value that relates to the ratio of identical values of data by field in the table and total volume of data in the table. Identification of the threshold ratio may be accomplished in several ways including receipt of the threshold ratio by user input or by calculating the threshold ratio, for example, as the fourth quartile of threshold ratios within a set of database tables.

Processing proceeds to step S265, where field locations mod 365 determines to reorder field locations in a first database table. In this example, when a threshold ratio is identified for a candidate database table, the table is identified as a target table for reordering field locations. By reordering field locations, such as moving columns of data from one location to another, the field datasets having relatively high numbers of identical values is moved forward to be located among leading field locations. Alternatively, processing may begin at this step where a user indicates that a particular database table should be reordered according to embodiments of the present invention.

Processing proceeds to step S270, where cardinality mod 370 computes field data cardinality for a set of fields in the first database. When a determination is made to reorder field locations, the cardinality of each field is evaluated to determine which fields to include in the leading fields of the table. In this example, each table is labeled with the computed cardinality of that field dataset. Alternatively, only fields having a cardinality below a target cardinality are labeled for processing. Alternatively, the top two or more fields are selected for relocation as forward located fields in the table. Those top fields are labeled with their corresponding cardinality.

Processing proceeds to step S275, where mapping mod 375 map field locations of the first database table and target field locations of a reordered database table. In this example, the field locations of the database table are mapped according to the order in which they are arranged prior to reordered the fields. Also, a target reordering of the fields is determined so that future field locations may be mapped for the table. In this example, fields are reordered such that the field having the lowest cardinality, which indicates the least unique values in the field dataset, is assigned to be the leading field. Then the field having the next lowest cardinality value is assigned to be the second leading field, and so forth until all of the target fields are reordered according to their cardinality values.

By mapping the field locations before and after the reorder process, incompatible changes for legacy applications are prevented from occurring. This mapping is mainly for insert applications.

The insert statement may omit the column name when every column value is specified. For example, the statement
 INSERT INTO T1(ID,TYPE,DOB,DESC) VALUES(1, 'A', '2021-9-15', '3C')
may be written as:
 INSERT INTO T1 VALUES(1,'A','2021-9-15','3C').

In this example, the original order is ID,TYPE,DOB, DESC. After the reorder, it might become TYPE,DOB, DESC,ID. In that way, the second type of INSERT statement will not work. With a mapping relationship recorded in the catalog table and/or in the table header for recognition, the database system will be able to assign each value to the correct columns.

Database system will be able to know whether it's a legacy application by comparing the date that the application was bound with the date reorder happened. Database system can go one step further to remind user about the application being affected, so that user can modify the application to avoid the extra mapping step to save CPU.

Processing proceeds to step S280, where reorder mod 380 reorders a plurality of fields of the first database table to create the reordered database table. In this example, the data definition language (DDL) command REORG is applied to tablespace to locate the selected fields as leading fields and the compression dictionary is rebuilt to align with terms in adjacent fields. When selected tables are reordered, the records are processed to update the compression dictionary for unique sets of values across fields. For example, if three columns are moved to leading field locations because of the cardinality evaluation, the unique set of values would be with reference to three-value sets leading the records.

Processing ends at step S285, where compression mod 385 performs a dictionary-based compression on the reordered database table. Upon reordering the target table according to embodiments of the present invention, the result of compressing the target table via dictionary-based compression will be an equal or increased compression ratio compared to a compression action prior to the reordering of the target table. The compressed table will be of an equal or smaller size but will at least be among the highest available compression ratios because of the careful reordering process to improve the compression ratio.

Further embodiments of the present invention are discussed in the paragraphs that follow.

Some embodiments of the present invention are directed to reordering the data distribution in a table to improve compression ratio for dictionary compression. The improved compression ratio results in a relatively smaller data size after compression when compared to convention processes.

Based on the statistics of data, database management system (DBMS) can identify the most frequently duplicating columns, or columns with more identical values. When the ratio of identical values to data volume of a table reaches a threshold, the DBMS adds a pending DDL change to reorder the columns in the table, arranging many of the identified columns as leading columns ordered by ascending number of unique entries. The pending DDL will be effective with the next REORG on tablespace as well as the dictionary rebuilding. With the reordered column, data distribution benefits the compression algorithm by assisting the identification of longer character strings to be replaced during compression. The longer the character string is that is replaced, the higher the compression ratio when compressed. The concept of reordered table columns for compression can improve legacy applications, which contain insert statements without specifying column names. A column mapping may be created for the reordered tables to ensure there are no incompatible changes made to the table.

As illustrated in Table 1, below, compression algorithms can only recognize each character string within a single column as repeatable patterns. There are two columns for the field names, Nationality and City, each with six text string patterns recognizable with the lengths from 7 to 8 characters. Table 2 shows the keys associated with the various target strings in the columns.

TABLE 1

Example Database Table.

| NAME | GENDER | DOB | NATION-ALITY | ADDRESS | CITY |
|---|---|---|---|---|---|
| Tom | Male | Jan. 1, 1980 | Chinese | 314 San St | Beijing |
| Jen | Female | Mar. 5, 1978 | American | 1205 Alba Dr | San Jose |
| Alan | Male | May 6, 2000 | Chinese | 918 Melb Av | Beijing |
| Kate | Female | Aug. 2, 1998 | Chinese | 909 CR Rd | Shanghai |
| Grace | Female | Jul. 9, 1994 | American | 200, Bldg. 9 | San Jose |
| Sam | Male | May 9, 2009 | American | 120, Unit 8 | New York |

TABLE 2

Dictionary Compression Key.

| STRING | KEY |
|---|---|
| Chinese | 01 |
| American | 02 |
| Beijing | 03 |
| San Jose | 04 |
| Shanghai | 05 |
| New York | 06 |

Table 3 shows the resulting compressed table upon applying the compression algorithm to the example database table.

TABLE 3

Conventional Compression of Example Database Table.

| NAME | GENDER | DOB | NATION-ALITY | ADDRESS | CITY |
|---|---|---|---|---|---|
| Tom | Male | Jan. 1, 1980 | 01 | 314 San St | 03 |
| Jen | Female | Mar. 5, 1978 | 02 | 1205 Alba Dr | 04 |
| Alan | Male | May 6, 2000 | 01 | 918 Melb Av | 03 |
| Kate | Female | Aug. 2, 1998 | 01 | 909 CR Rd | 05 |
| Grace | Female | Jul. 9, 1994 | 02 | 200, Bldg. 9 | 04 |
| Sam | Male | May 9, 2009 | 02 | 120, Unit 8 | 06 |

According to some embodiments of the present invention the original column layout of a table to be compressed, such as Table 1, is reordered based on table statistics. Because certain columns in a table often include text having a relatively small cardinality, the data of those columns is more often duplicated than data in other columns. Table 4 shows how the example table of Table 1 is reordered for improved compression. Columns of lower cardinality such as GENDER, NATIONALITY, and CITY are adjacent one another. According to some embodiments of the present invention, the lowest cardinality column is the lead column and subsequent adjacent columns are arranged in the order of increasing cardinality.

Arranging the low-cardinality columns to be adjacent one another allows the compression algorithm to recognize a longer repeatable character string than would be possible in the original arrangement of columns. Accordingly, the compression ratio is increased over the original table because the single longer string is replaced with shorter keys than if there were multiple shorter text strings being compressed. The data associated with a given field is referred to herein as field data. For each field represented by a column in the example tables, there is a set of field data for which field data cardinality is computed. Table 5 shows example field data cardinality values of the example table to be compressed.

TABLE 4

Reordered Example Database Table.

| GENDER | NATION-ALITY | CITY | DOB | NAME | ADDRESS |
|---|---|---|---|---|---|
| Male | Chinese | Beijing | Jan. 1, 1980 | Tom | 314 San St |
| Female | American | San Jose | Mar. 5, 1978 | Jen | 1205 Alba Dr |
| Male | Chinese | Beijing | May 6, 2000 | Alan | 918 Melb Av |
| Female | Chinese | Shanghai | Aug. 2, 1998 | Kate | 909 CR Rd |
| Female | American | San Jose | Jul. 9, 1994 | Grace | 200, Bldg. 9 |
| Male | American | New York | May 9, 2009 | Sam | 120, Unit 8 |

TABLE 5

Field Data Cardinality.

| FIELD | CARDINALITY |
|---|---|
| Name | 5.9E7 |
| Gender | 2 |
| DOB | 365 |
| Nationality | 10 |
| Address | 2.5E9 |
| City | 147 |

Some embodiments of the present invention are directed to using statistical characteristics of database tables in order to advantageously reorder, or rearrange, the columns of the table. According to some embodiments of the present invention, the advantageous rearrangement causes the columns to be ordered by ascending cardinality. The compression algorithm is able to recognize a longer text string as duplicated resulting in fewer individual duplicated text string patterns. For example, as shown in Table 6, there are four string patterns recognized with lengths of 15 to 17 characters, increased from lengths of 7 to 8 characters using a conventional method (See table 2). In some cases where there are large amounts of data, fields such as the date of birth (DOB) may also be recognized into the string pattern being replaced.

TABLE 6

Dictionary Compression Key with Improved Data Distribution.

| STRING | VALUE |
|---|---|
| M/Chinese/Beijing | 01 |
| F/American/San Jose | 02 |
| F/Chinese/Shanghai | 03 |
| M/American/New York | 04 |

Table 7 shows the resulting compressed table upon applying the compression algorithm to the reordered database table.

TABLE 7

Compressed Reordered Example Database Table.

| GENDER | NATIONALITY | CITY | DOB | NAME | ADDRESS |
|---|---|---|---|---|---|
| 01 | | | Jan. 1, 1980 | Tom | 314 San St |
| 02 | | | Mar. 5, 1978 | Jen | 1205 Alba Dr |
| 01 | | | May 6, 2000 | Alan | 918 Melb Av |
| 03 | | | Aug. 2, 1998 | Kate | 909 CR Rd |
| 02 | | | Jul. 9, 1994 | Grace | 200, Bldg. 9 |
| 04 | | | May 9, 2009 | Sam | 120, Unit 8 |

Some embodiments of the present invention are directed to a process including the steps: (i) performing the command RUNSTATS on database tables; (ii) identify the cardinality value on every column; (iii) reorder the columns of the table by ascending cardinality; (iv) run a dictionary compression algorithm on the reordered column table data by reorganizing the table and/or reloading table according to ascending cardinality.

Some embodiments of the present invention are directed to using database table statistics to identify columns that may be reordered to improve the compression process.

Some embodiments of the present invention are directed to rearranging data columns to help the compression algorithm to recognize longer character strings for replacement, thus increasing the compression ratio of the compressed table.

Some embodiments of the present invention are directed to mapping relationships between the column order before rearrangement and the column order after rearrangement to prevent incompatible changes in some applications, especially legacy applications.

Some embodiments of the present invention are directed to a process for increasing the potential compression ratio of a table by reordering table columns. Specifically, process steps including: (i) the step of utilizing database table statistics to identify data that needs to be reordered; (ii) the step of reordering data to help compression algorithm to recognize longer strings to be replaced in order to increase compression ratio; and (iii) the step of mapping relationship between before-after column order, to prevent incompatible changes for legacy applications.

Some embodiments of the present invention do more than increase compression ratio by reordering table columns and merely utilizing database table statistics and simply reordering data to help the compression algorithm to recognize longer strings to be replaced, in order to increase compression ratio.

Some embodiments of the present invention may include one, or more, of the following features, characteristics and/or advantages: (i) better compression ratio is achieved; (ii) better compression ratio means many benefits like better throughput and lower ownership cost; (iii) the compression process considers the data/field patterns in the database prior to performing compression; and/or (iv) optimizes distribution of data in database to dramatically impact compression ratio.

Some embodiments of the present invention are directed to using the statistics in a database to determine the ordering. Some embodiments of the present invention involve legacy applications inserting problem with reordered data. Some embodiments of the present invention are directed to row storing databases and are directed to including a mechanism to adjust legacy applications.

Some embodiments of the present invention are directed to reordering columns to elongate the repeating pattern based on data statistics to maximize compression ratio. Some embodiments of the present invention involve structured database data so there are statistics available to be used to determine the reordering. Some embodiments of the present invention are directed to a mechanism of mapping column order before and after the reordering.

Some embodiments of the present invention are directed to using reordered columns to put consecutive repeating data together for an improved compression rate where the reordering is based on existing structured data statistics. Some embodiments of the present invention are directed to a mechanism of mapping for previous and after column sequence to adapt legacy applications. Some embodiments of the present invention are directed to reordering columns of a row-stored database to elongate the repeating pattern for improved compression ratio.

Some helpful definitions follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

User/subscriber: includes, but is not necessarily limited to, the following: (i) a single individual human; (ii) an artificial intelligence entity with sufficient intelligence to act as a user or subscriber; and/or (iii) a group of related users or subscribers.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

What is claimed is:

1. A computer-implemented method for reordering data distribution in database tables, the method comprising:
   identifying a threshold ratio for reordering field locations in a set of database tables, the threshold ratio comparing a number of identical values by field in a database table to a total data volume of the database table;
   determining to reorder field locations in a first database table of the set of database tables based on the first database table meeting the identified threshold ratio;
   determining field data cardinality for a set of fields in the first database table;
   selecting a sub-set of fields of the first database table to be located among leading field locations of the first databased table, the sub-set of fields having field data cardinality values lower than remaining fields in the set of fields; and
   reordering the first database table such that the selected sub-set of fields are leading fields in the reordered database table, thereby creating a reordered database table, a data field located first among the leading fields having a lowest field data cardinality value and an adjacent field having a second lowest field data cardinality value.

2. The method of claim 1, wherein the reordering step further sorts records in the reordered database table such that records having identical adjacent field values are arranged adjacent each other.

3. The method of claim 1, further comprising:
   collecting statistical data for the database tables including the number of identical values in each field of the database tables, a data volume of each database table, and field data cardinality for each field in the database tables.

4. The method of claim 1, further comprising:
   mapping original field locations of the first database table prior to the reordering step; and
   mapping target field locations of the reordered database.

5. The method of claim 1, further comprising:
   rebuilding a compression dictionary according to sets of leading record values of the reordered table, each set of leading record values including values in the selected sub-set of fields.

6. The method of claim 1, further comprising:
   performing a dictionary-based compression on the reordered database table.

7. The method of claim 1, wherein:
   the database table is a row store table; and
   the set of fields are organized as columns of data.

8. A computer program product comprising a computer-readable storage medium having a set of instructions stored therein which, when executed by a processor, causes the processor to reorder data distribution in database tables by:
   identifying a threshold ratio for reordering field locations in a set of database tables, the threshold ratio comparing a number of identical values by field in a database table to a total data volume of the database table;
   determining to reorder field locations in a first database table of the set of database tables based on the first database table meeting the identified threshold ratio;
   determining field data cardinality for a set of fields in the first database table;
   selecting a sub-set of fields of the first database table to be located among leading field locations of the first databased table, the sub-set of fields having field data cardinality values lower than remaining fields in the set of fields; and
   reordering the first database table such that the selected sub-set of fields are leading fields in the reordered database table, thereby creating a reordered database table, a data field located first among the leading fields having a lowest field data cardinality value and an adjacent field having a second lowest field data cardinality value.

9. The computer program product of claim 8, wherein the reordering step further sorts records in the reordered database table such that records having identical adjacent field values are arranged adjacent each other.

10. The computer program product of claim 8, further causing the processor to reorder data distribution in database tables by:
    collecting statistical data for the database tables including the number of identical values in each field of the database tables, a data volume of each database table, and field data cardinality for each field in the database tables.

11. The computer program product of claim 8, further causing the processor to reorder data distribution in database tables by:
    performing a dictionary-based compression on the reordered database table.

12. The computer program product of claim 8, wherein:
    mapping original field locations of the first database table prior to the reordering step; and
    mapping target field locations of the reordered database.

13. A computer system for reordering data distribution in database tables, the computer system comprising:
    a processor set; and
    a computer readable storage medium;
    wherein:
    the processor set is structured, located, connected, and/or programmed to run program instructions stored on the computer readable storage medium; and
    the program instructions which, when executed by the processor set, cause the processor set to reorder data distribution in database tables by:
      identifying a threshold ratio for reordering field locations in a set of database tables, the threshold ratio comparing a number of identical values by field in a database table to a total data volume of the database table;
      determining to reorder field locations in a first database table of the set of database tables based on the first database table meeting the identified threshold ratio;
      determining field data cardinality for a set of fields in the first database table;
      selecting a sub-set of fields of the first database table to be located among leading field locations of the first databased table, the sub-set of fields having field data cardinality values lower than remaining fields in the set of fields; and
      reordering the first database table such that the selected sub-set of fields are leading fields in the reordered database table, thereby creating a reordered database table, a data field located first among the leading fields having a lowest field data cardinality value is a leading field and an adjacent field having a second lowest field data cardinality value.

14. The computer system of claim 13, wherein the reordering step further sorts records in the reordered database table such that records having identical adjacent field values are arranged adjacent each other.

15. The computer system of claim 13, further causing the processor to reorder data distribution in database tables by:
collecting statistical data for the database tables including the number of identical values in each field of the database tables, a data volume of each database table, and field data cardinality for each field in the database tables.

16. The computer system of claim 13, further causing the processor to reorder data distribution in database tables by:
performing a dictionary-based compression on the reordered database table.

17. The computer system of claim 13, wherein:
mapping original field locations of the first database table prior to the reordering step; and
mapping target field locations of the reordered database.

* * * * *